(12) United States Patent
Merrill

(10) Patent No.: US 6,727,521 B2
(45) Date of Patent: Apr. 27, 2004

(54) VERTICAL COLOR FILTER DETECTOR GROUP AND ARRAY

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 30 days.

(21) Appl. No.: 09/884,863

(22) Filed: Jun. 18, 2001

(65) Prior Publication Data

US 2002/0058353 A1 May 16, 2002

Related U.S. Application Data

(60) Provisional application No. 60/235,249, filed on Sep. 25, 2000.

(51) Int. Cl.[7] .................. H01L 33/00; H01L 31/113
(52) U.S. Cl. .................. 257/98; 257/440; 257/294
(58) Field of Search .................. 257/98, 294, 449, 257/55, 57, 427

(56) References Cited

U.S. PATENT DOCUMENTS

| | | | |
|---|---|---|---|
| 3,971,065 A | 7/1976 | Bayer | 358/41 |
| 4,011,016 A | 3/1977 | Layne et al. | 356/195 |
| 4,238,760 A | 12/1980 | Carr | 357/30 |
| 4,309,604 A | 1/1982 | Yoshikawa et al. | 250/226 |
| 4,318,115 A | * 3/1982 | Yoshikawa et al. | 257/435 |
| 4,613,895 A | 9/1986 | Burkey et al. | 358/41 |
| 4,651,001 A | 3/1987 | Harada et al. | 250/330 |
| 4,677,289 A | 6/1987 | Nozaki et al. | 250/226 |
| 4,772,335 A | 9/1988 | Huang | 136/258 |
| 5,397,734 A | 3/1995 | Iguchi et al. | 437/70 |
| 5,502,299 A | 3/1996 | Standley | 250/208.2 |
| 5,668,596 A | 9/1997 | Vogel | 348/222 |
| 5,739,562 A | 4/1998 | Ackland et al. | 257/291 |
| 5,872,371 A | 2/1999 | Guidash et al. | 257/230 |
| 5,883,421 A | 3/1999 | Chouikha et al. | 257/461 |
| 5,889,315 A | 3/1999 | Farrenkopf et al. | 257/552 |
| 5,899,714 A | 5/1999 | Farrenkopf et al. | 438/202 |
| 5,965,875 A | 10/1999 | Merrill | 250/226 |
| 6,078,037 A | 6/2000 | Booth, Jr. | 250/208.1 |

FOREIGN PATENT DOCUMENTS

| | | | |
|---|---|---|---|
| JP | 61 187282 | 8/1986 | H01L/31/10 |
| JP | 01 134966 | 5/1989 | H01L/27/14 |
| JP | 0.605.898 | 7/1994 | H01L/27/146 |
| WO | WO 98/19455 | 5/1998 | H04N/3/15 |

OTHER PUBLICATIONS

S. Chamberlain, "Photosensitivity and Scanning of Silicon Image Detector Arrays", *IEEE Journal of Solid–State Circuits*, vol. SC–4, No. 6, pp. 333–342, Dec. 1969.

(List continued on next page.)

*Primary Examiner*—W. David Coleman
(74) *Attorney, Agent, or Firm*—Sierra Patent Group, Ltd.

(57) ABSTRACT

A vertical color filter detector group according to the present invention is formed on a semiconductor substrate and comprises at least six layers of alternating p-type and n-typed doped regions. PN junctions between the layers operate as photodiodes with spectral sensitivities that depend on the absorption depth versus wavelength of light in the semiconductor. Alternate layers, preferably the n-type layers, are detector layers to collect photo-generated carriers, while the intervening layers, preferably p-type, are reference layers and are connected in common to a reference potential referred to as ground. Each detector group includes a blue-sensitive detector layer at an n-type layer at the surface of the semiconductor, a green-sensitive detector layer at an n-type layer deeper in the semiconductor, and a red-sensitive detector layer at the n-type layer deepest in the semiconductor. The blue-sensitive detector layer at the surface of the semiconductor may have a reference layer only below it, while the red- and green-sensitive detector layers have reference layers above and below them. Three sets of active pixel sensor circuitry are coupled to the three detector layers, such that three active pixel sensors are formed using the group of three co-located detectors of the vertical color filter detector group.

22 Claims, 12 Drawing Sheets

OTHER PUBLICATIONS

R. Wolffenbuttel et al., "A Novel Approach to Solid–state Colour Sensing", *Senors and Actuators*, vol. 9, pp. 199–211, 1986 (no month).

R. Wolfenbuttel et al., "Performance of an Integrated Silicon Colour Sensor with a Digital Output in Terms of Response to Colours in the Colour Triangle", *Sensors and Actualtors*, vol. A21–A23, pp. 574–580, 1990 (no month).

P. Seitz et al., "Smart optical and image sensors fabricated with industrial CMOS/CCD semiconductor processes", *SPIE*, vol. 1900, pp. 21–30, Jan. 1993.

J. Kramer, "Photo–ASICs: Integrated Optical Metrology systems with Industrial CMOS Technology", *Doctorial Dissertation: Diss Eth Nr. 10186*. MSc Imperial College of Science and Technology, pp. 44–47, 1993.

M. Chouikha, "Color sensitive photodetectors in standard CMOS and BiCMOS technologies", *SPIE*, vol. 2950, pp. 108–120, Aug. 1996.

H Wong, "Technology and Device Scaling Considerations for CMOS Imagers", *IEEE Transactions on Electron Devices*, vol. 43, No. 12, Dec. 1996.

K. Parulski, "Enabling technologies for a family of digital cameras", *SPIE*, vol. 2654, Paper 18, pp. 156–163, 1996 (no month).

B Weibel, "High–end digital cameras can make professional indoor photography a snap", *Buyers Guide*, pp. 311–317, Apr. 1997.

D Sutherland, "Neaveau Niche–Part 1: The Latest in digital SLRs", *Shutterbug*, pp. 200–209, Nov. 1997.

M. Chouikha, "Buried Triple p–n Junction Structure in a BiCMOS Technology for Color Detection", *IEEE BCTM 6.4*, pp. 108–111, 1997 (no month).

A. Theuwissen, "Fundamentals of Solid–State Imaging", *Solid–State Imaging with Charge–coupled Devices*, pp. 131–141, 1995 Reprinted with corrections 1996,1997.

R. Guidash, "A 0.6 um CMOS Pinned Photodiode Color Imager Technology", *IEDM*, pp. 927–929, 1997 (no month).

D. Knipp, "Low Cost Approach to Realize Novel Detectors for Color Recognition", *Proc. ICPS 98* (International Congress on Imaging Science), pp. 350–353, Sep. 1998.

H Miura, "A 100 Frame/s CMOS Active Pixel Sensor for 3D–Gesture Recognition System" 1999 IEEE International Solid–State Circuits Conference, pp. 142–143, Jun. 1999.

Stiebig et al., Transient Behavior of Optimized nipiin Three–Color Detectors, *IEEE Transactions on Electron Devices*, vol. 45, No. 7, pp. 1438–1443, Jul. 1998.

* cited by examiner

VERTICAL COLOR FILTER DETECTOR GROUP AND ARRAY

PRIORITY

This application claims benefit of U.S. Provisional Patent Application Serial No. 60/235,249, filed Sep. 25, 2000.

BACKGROUND OF THE INVENTION

1. Field of the Invention

The present invention relates to active pixel sensors. More particularly, the present invention relates to full-color detector groups and arrays that use semiconductor material to chromatically filter light vertically and sense multiple wavelength bands at the same location.

2. The Prior Art

MOS active pixel sensors are known in the art. Multiple wavelength active pixel sensors are also known in the art. One type of multiple wavelength active pixel sensor employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per pixel as these sensors are tiled together in a plane.

Another type of multiple wavelength vertical pixel sensor employs more than one sensor in a vertically-oriented arrangement. An example of an early multiple wavelength vertical pixel sensor for detecting visible and infra-red radiation is disclosed in U.S. Pat. No. 4,238,760 to Carr, in which a first diode in a surface n-type epitaxial region is responsive to visible light and a second buried region in an underlying n-type substrate is responsive to infrared radiation. Contact to the buried photodiode is made using deep diffusion processes similar to diffusion-under-film collector contact diffusion common in bipolar IC processing and for $R_{CS}$ reduction. The disclosed device has a size of 4 mils square. An alternate embodiment employs V-groove MOS transistors to contact the buried p-type region of the infrared diode.

The device disclosed in the Carr patent has several shortcomings, the most notable being its large area, rendering it unsuitable for the image sensor density requirements of modern imaging systems. The technology employed for contact formation to the buried infrared sensing diode is not suitable for modem imaging technology or extension to a 3-color sensor.

A particular example of a three-color visible-light prior art vertical pixel sensor group is disclosed in U.S. Pat. No. 5,965,875 to Merrill in which a structure is provided using a triple-well CMOS process wherein the blue, green, and red sensitive PN junctions are disposed at different depths beneath the surface of the semiconductor substrate upon which the imager is fabricated.

This prior three-color sensor group permits fabrication of a dense imaging array because the three colors are sensed over approximately the same area in the image plane. However, this structure has several shortcomings. First, this pixel sensor group uses a reverse-polarity central green-sensitive PN junction, requiring modified circuits or voltage ranges, possibly involving PMOS transistors in addition to the usual NMOS transistors, to sense and read out the green channel. This requirement disadvantageously increases sensor area and complicates support circuits in the array.

Furthermore, an imaging array fabricated using the technology in the Merrill patent requires use of an annular n-well isolation ring within the sensor group pixel area. Such isolation rings consume a large amount of pixel area in the array.

In addition, the junction depths of the three photodiodes are not optimally matched to the absorption depths of the blue, green, and red photons, resulting in inappropriate filter crossover points and poor green filter selectivity.

Finally, the three photodiodes interact with each other. The net result is potential image lag or a requirement for additional control circuitry.

BRIEF DESCRIPTION OF THE INVENTION

A vertical color filter detector group according to the present invention is formed on a semiconductor substrate and comprises a plurality of detector layers configured by doping and/or biasing to collect photo-generated carriers of a first polarity, preferably negative electrons, separated by additional intervening reference layers configured to collect and conduct away photo-generated carriers of the opposite polarity, preferably positive holes. The detector layers have different spectral sensitivities based on their different depths in the semiconductor substrate, doping levels and biasing conditions. The detector layers are individually connected to active pixel sensor readout circuits. In one example of such a detector group, each detector group includes a blue photodetector n-type layer at the surface of the semiconductor, a green photodetector n-type layer deeper in the semiconductor, and a red photodetector n-type layer deepest in the semiconductor. The blue photodetector at the surface of the semiconductor may optionally have a reference layer only below it, while the red and green photodetectors have reference layers above and below their detector layers. Three sets of active pixel sensor circuitry are coupled to the three detector layers, such that three active pixel sensors are formed using the group of three co-located photodetectors of the vertical color filter detector group.

According to one example, a vertical color filter detector group is formed on a semiconductor substrate and comprises at least six layers of alternating p-type and n-typed doped regions, one of which can be the substrate itself. PN junctions between the layers operate as photodiodes with spectral sensitivities that depend on the absorption depth versus wavelength of light in the semiconductor. Alternate layers, preferably the n-type (but could be p-type) layers, are detector layers to collect photo-generated carriers, while the intervening layers, preferably p-type (but could be n-type), are reference layers and are connected in common to a reference potential referred to as ground. In an embodiment where the detector layers are n-type layers, each detector group includes a blue photodetector n-type layer at the surface of the semiconductor, a green photodetector n-type layer deeper in the semiconductor, and a red photodetector n-type layer deepest in the semiconductor. The blue photodetector layer at the surface of the semiconductor may optionally have a reference layer only below it, while the red and green photodetector layers have reference layers above and below their detector layers. Three sets of active pixel sensor circuitry are coupled to the three detector layers, such that three active pixel sensors are formed using the group of three co-located photodetectors of the vertical color filter detector group. From this disclosure, persons of ordinary skill in the art will recognize that structures are contemplated herein in which other layers, (i.e., intrinsic layers) are disposed between the at least six layers.

According to another aspect of the present invention, a process is disclosed for fabricating the vertical color filter pixel sensor of the present invention.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

The vertical color filter detector group of the present invention solves the problems of the prior art at the expense of additional front-end process steps, including epitaxial depositions. The photodiode type described herein will allow a 7 um×7 um pixel with 50% utilization using a circa 2000 0.18 um process.

Figure 1:
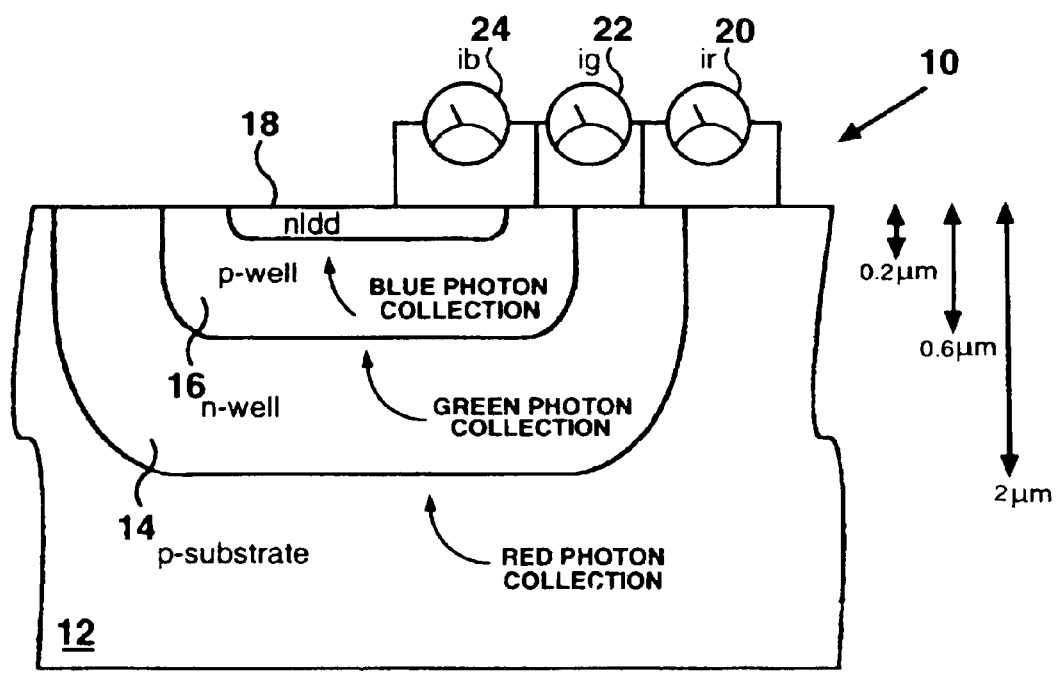
FIG. 1 is a cross-sectional view of a prior-art three-color vertical color filter pixel sensor.

Referring first to FIG. 1, a cross-sectional view shows a prior-art vertical color filter detector group 10 of the type disclosed in U.S. Pat. No. 5,965,875 to Merrill. FIG. 1 shows a vertical color filter detector group structure fabricated in a triple-well process wherein the blue, green, and red sensors are disposed at different depths beneath the surface of the semiconductor substrate 12 upon which the imager is fabricated. As may be seen from an examination of FIG. 1, the red photodiode is comprised of the junction between the p-type substrate and the n-type well 14, the green photodiode is comprised of the junction between the n-type well 14 and the p-type well 16, and the blue photodiode is comprised of the junction between the p-type well 16 and the n-type lightly-doped-drain implant 18 at the surface of the substrate. Photocurrent is sensed from the red, green, and blue photodiodes as indicated symbolically by current meters 20, 22, and 24, respectively.

As will be appreciated by persons of ordinary skill in the art, the photodiodes in the vertical color filter pixel sensor of FIG. 1 are connected directly to one another in series and are thus of alternating polarity. This photodiode structure complicates the transistor circuitry with which it is used.

Figure 2A:
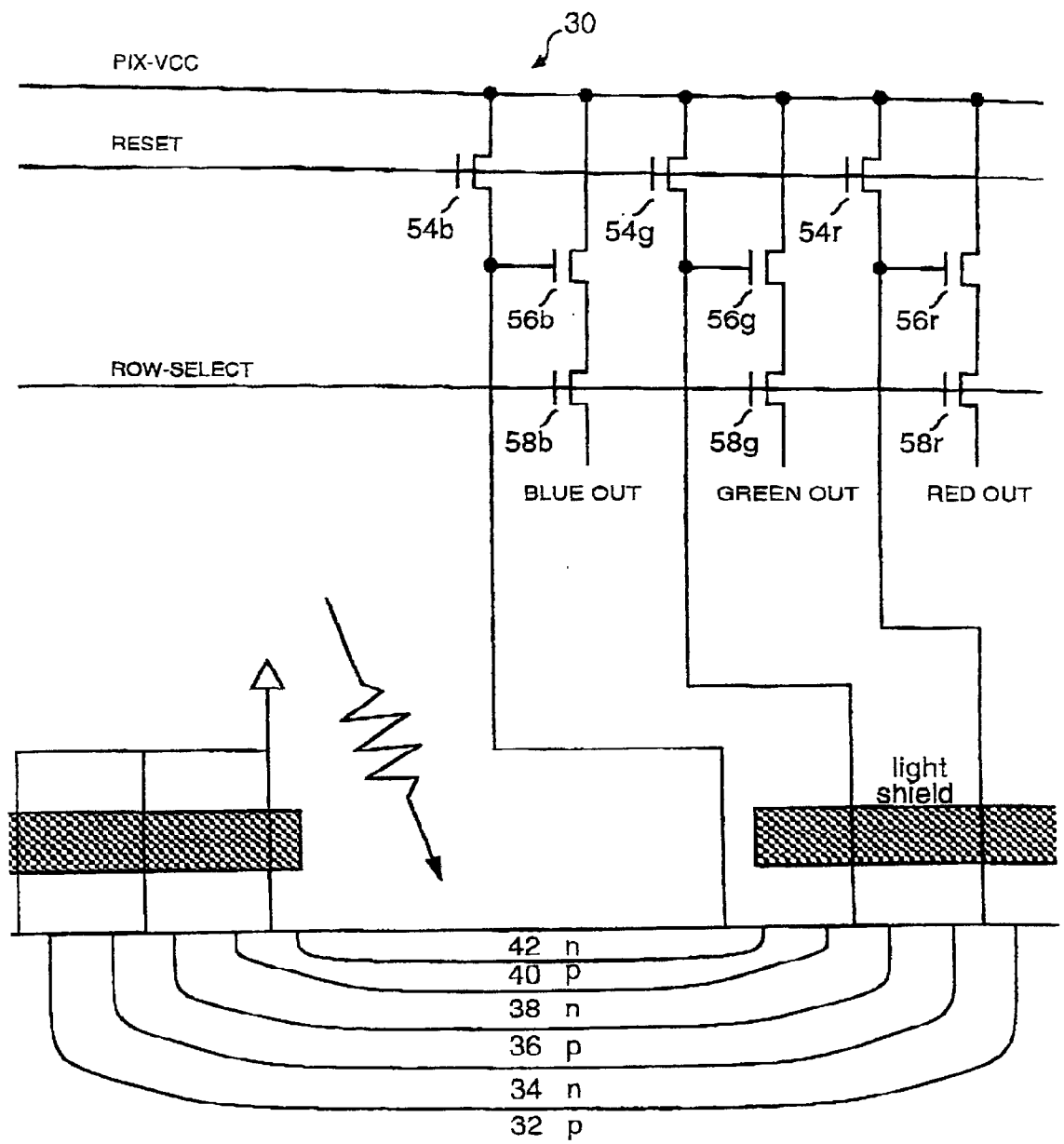
FIG. 2A is a combination semiconductor cross sectional diagram and schematic diagram of a vertical color filter pixel sensor according to the present invention.

Referring now to FIG. 2A, a vertical color filter detector group 30 according to an illustrative embodiment of the present invention is a six-layer structure that is shown schematically in cross-sectional view fabricated on p-type semiconductor substrate 32. This type of vertical color filter detector group has three n-type photodiodes, isolated vertically by p-regions that are all connected to substrate potential. The vertical color filter detector group of the present invention can be fabricated in a number of different ways and is thus shown very generally in FIG. 2A.

Figure 2B:
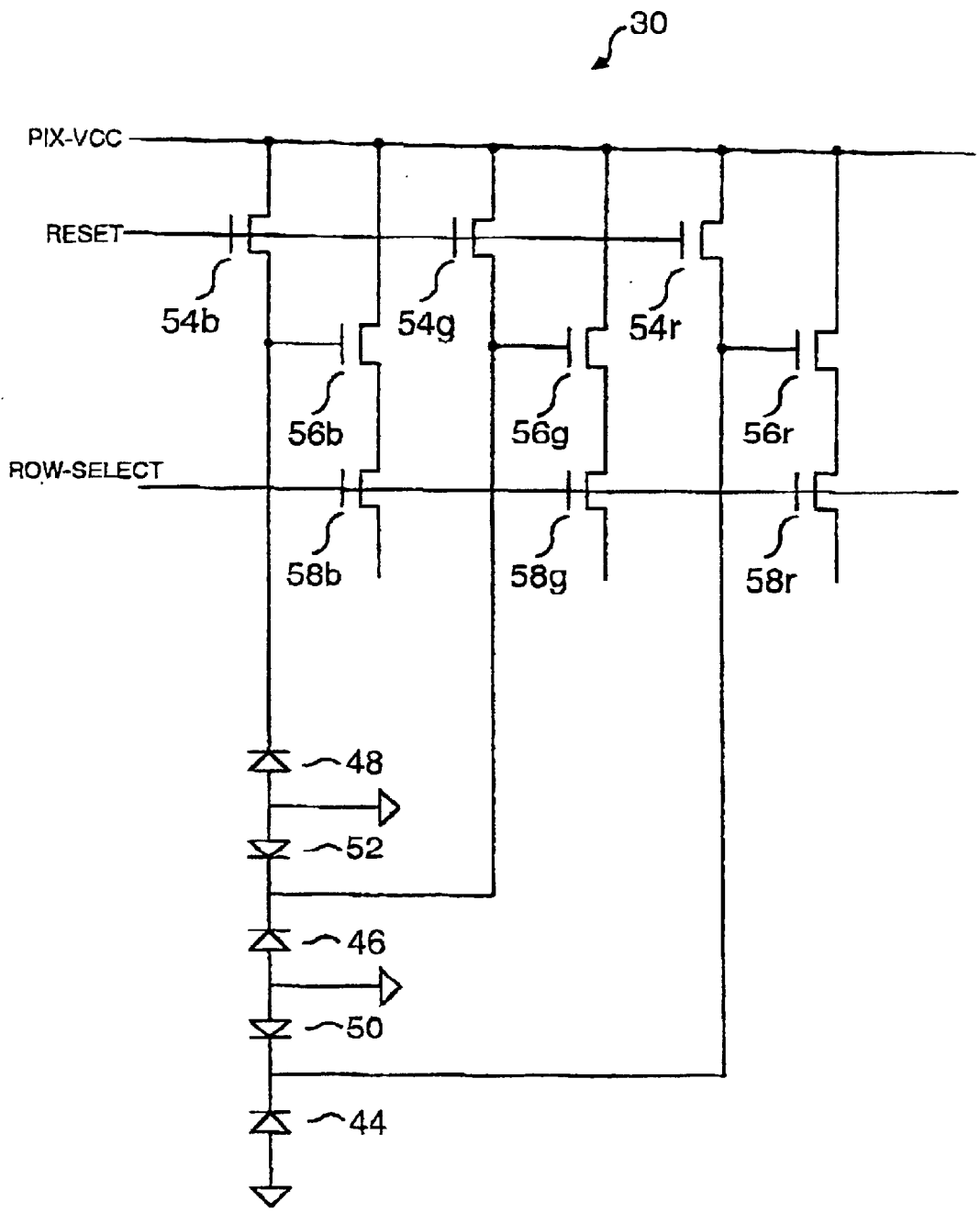
FIG. 2B is a combination semiconductor cross sectional diagram and schematic diagram depicting the same vertical color filter pixel sensor as shown in FIG. 2A in which the photodiodes are represented schematically as semiconductor diode symbols.

The vertical color filter detector group depicted in FIG. 2A employs a six-layer structure wherein the blue, green, and red photodiode sensors are disposed at different depths beneath the surface of the semiconductor structure. Unlike the vertical color filter pixel sensor of FIG. 1, the addition of the extra layers results in a structure in which the red, green, and blue photocurrent signals are all taken from the n-type cathodes of three isolated photodiodes. This is shown schematically in FIG. 2B, depicting the same vertical color filter detector group as shown in FIG. 2A in which the photodiodes are represented schematically as semiconductor diode symbols.

Examining the structure of FIG. 2A in more detail, n-type region 34 lies above p-type region 32, which may be the semiconductor substrate or may be another p-type region in the semiconductor structure. The red photodiode has p-type regions 32 and 36 as its anode and n-type region 34 as its cathode. The output of the red photodiode is a contact from n-type region 34. The p-type region 32 is coupled to a fixed potential such as ground.

A p-type region 36 is disposed above n-type region 34, and an n-type region 38 is disposed above p-type region 36. The green photodiode has p-type regions 36 and 40 as its anode and n-type region 38 as its cathode. The output of the green photodiode is a contact from n-type region 38. The p-type region 36 is coupled to the same fixed potential as substrate 32 and, as will be appreciated by persons of ordinary skill in the art, is another anode for the red sensor.

A p-type region 40 is disposed above n-type region 38, and an n-type region 42 is disposed above p-type region 40. The blue photodiode has p-type region 40 as its anode and n-type region 42 as its cathode. The output of the blue photodiode is a contact from n-type region 42. The p-type region 40 is coupled to the same fixed potential as substrate 32 and, as will be appreciated by persons of ordinary skill in the art, is another anode for the green sensor.

Persons of ordinary skill in the art will observe that all of the red, green, and blue photodiodes (indicated at reference numerals 44, 46, and 48, respectively, in FIG. 2B) are operated in reverse bias. In FIG. 2B, each of these photodiodes is shown having its p-type region anode coupled to ground. Such skilled persons will also observe that upside down diodes 50 and 52 are formed in series between each of the red, green, and blue photodiodes and serve as additional reverse-bias-operated photodiodes. Thus, a diode 50 has p-type region 36 as its anode and n-type region 34 as its cathode. A diode 52 has p-type region 40 as its anode and n-type region 38 as its cathode. Because of this structure and resulting alternating polarity diodes, the outputs of the blue, green, and red photodiodes are identical in polarity and can easily drive identical transistor circuits in the vertical color filter detector group without any of the drawbacks of the prior-art vertical color filter pixel sensors, such as the one depicted in FIG. 1.

Both FIGS. 2A and 2B show a non-storage version of the vertical color filter pixel of the present invention in which each of the red, green, and blue photodiodes is coupled to a transistor circuit. Each circuit has a reset transistor 54 driven from a RESET signal line and coupled between the photodiode cathode and a reset potential, a source-follower amplifier transistor 56 coupled to the photodiode cathode, and a row-select transistor 58 driven from a ROW-SELECT signal line and coupled between the source of the source follower amplifier transistor and a row line. The suffixes "r", "g", and "b" are used to denote the color associated with each transistor in FIGS. 2A and 2B. As is known in the art, the RESET signal is active to reset the pixel and is then inactive during exposure, after which the row select line is activated to read out the pixel data.

Figure 2C:
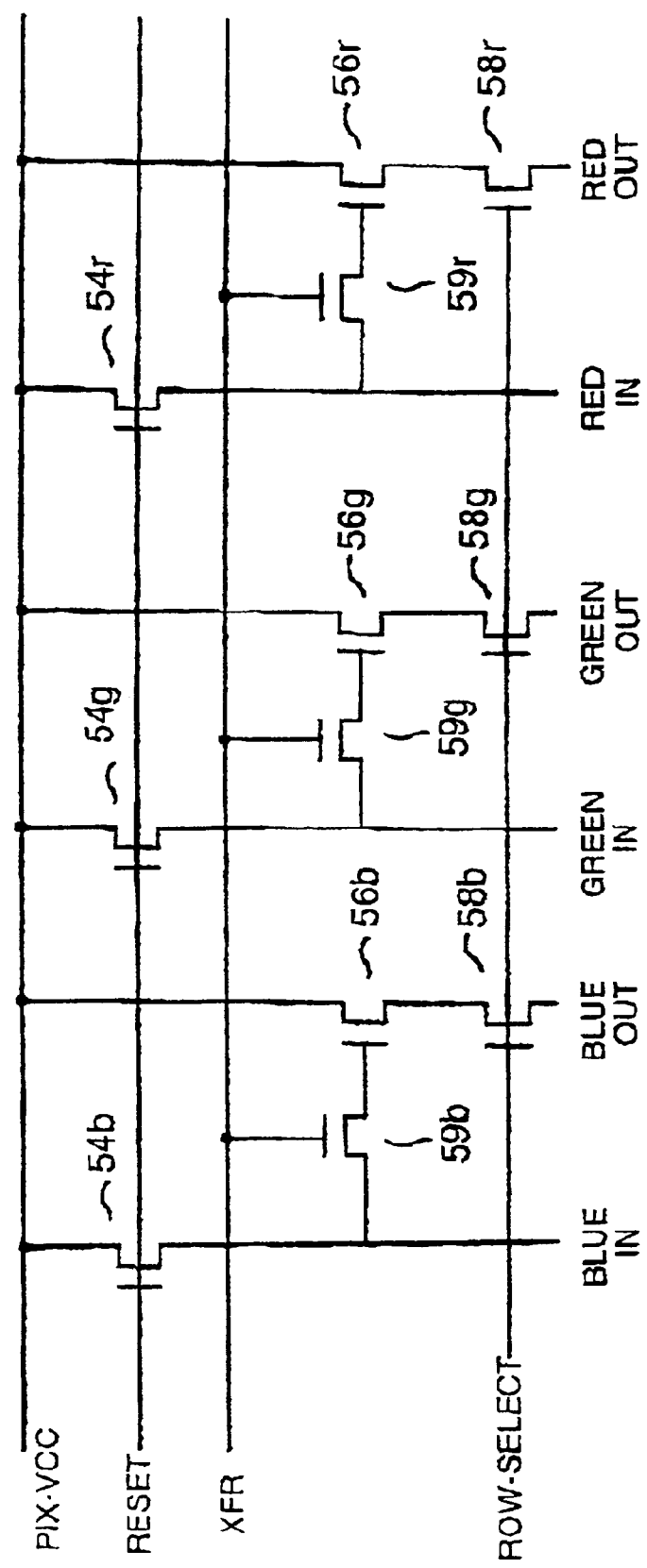
FIG. 2C is a schematic diagram depicting transistor circuitry that may be used in a storage version of the vertical color filter pixel of the present invention to which each of the red, green, and blue photodiodes is coupled.

Referring now to FIG. 2C, a schematic diagram depicts transistor circuitry that may be used in a storage version of the vertical color filter pixel of the present invention to which each of the red, green, and blue photodiodes is coupled. As will be appreciated by persons of ordinary skill in the art, the transistor circuit of FIG. 2C includes an additional transfer transistor 59 not found in the circuits of FIGS. 2A and 2B. The gate of transfer transistor 59 is coupled to a XFR line that is held active for at least part of the time that the RESET line is active and goes inactive at the end of the exposure time, after which the row select line is activated to read out the pixel data. One advantage of the circuit of FIG. 2C is that the use of the transfer transistors eliminates the need for a mechanical shutter.

Another difference in the schematic diagram of FIG. 2C is that the drains of Amplifier transistors 56b, 56g, and 56r are source follower transistors connected to a VSFD line instead of to Vcc. The voltage potential VSFD may be held fixed at a supply voltage V+(which may be, for example, about 1–3 volts depending on the technology) or may be pulsed.

To increase the input-to-output voltage gain of source follower transistors 56b, 56g, and 56r, it is possible to pulse their drain terminals. If the VSFD signal at the drains of the source follower transistors 56b, 56g, and 56 is pulsed, current will flow only when it is high. It may be advantageous to pulse drains of the source follower transistors 56b, 56g, and 56 with a low duty cycle to save power during exposure. Pulsing the drains of the source follower transistors 56b, 56g, and 56 also keeps the photodiode voltages lower during the time the drain is low, which can beneficially reduce voltage-dependent leakage at those nodes.

There are several advantages obtained by use of the vertical color filter detector group of the present invention. First, only NMOS transistors are used in the sensing circuitry, which compared to a structure that would use opposite polarity transistors for the green channel, has one half the control wires for a given pixel configuration, and occupies much less space because n-wells are not needed for PMOS devices as in prior-art schemes. The simplest pixel support needed for the vertical color filter detector group of the present invention requires only a total of six array wires running across the sensors.

From the disclosure of this illustrative embodiment of the three-color vertical color filter detector group of the present invention, persons of ordinary skill in the art will recognize that additional colors and/or other colors may be sensed according to the present invention by adding additional layers and/or changing the junction depths.

In addition, there is no image lag associated with the barrier gate mode that is sometimes used with pixel sensors. There is no interaction between the red, green, and blue photodiodes because of the isolation between sensors provided by the alternating-polarity diodes present in the structure.

None of the problems associated with complementary array support circuits, such as phase lag associated with digital and analog level shifters, are present in the pixel sensor of the present invention. Finally, the junction depths of the pixel sensor of the present invention may be more closely matched to the optimal junction depths for absorption of the red, green, and blue wavelengths, as shown in Table 1.

TABLE 1 junction depths for blue, green, and red detectors

| Color | wavelength | optimal junction depth um | Triple-Well CMOS | Present Invention |
| --- | --- | --- | --- | --- |
| Blue | 450 | 0.1–0.4 | 0.15 | 0.1–0.4 |
| Green | 550 | 0.8–1.2 | 0.5 | 0.8–1.2 |
| Red | 650 | 1.5–3.5 | 1.1 | 1.5–3.5 |

Table 1: junction depths for blue, green, and red detectors.

From the disclosure herein, persons of ordinary skill in the art will recognize that there are numerous ways to realize the vertical color filter detector group of the present invention in a semiconductor structure. In one illustrative embodiment of the present invention, the six-layer structure of alternating p-type and n-type regions can be formed using a semiconductor substrate as the bottom layer and forming five concentric wells of alternating conductivity type in the substrate.

Figure 3:
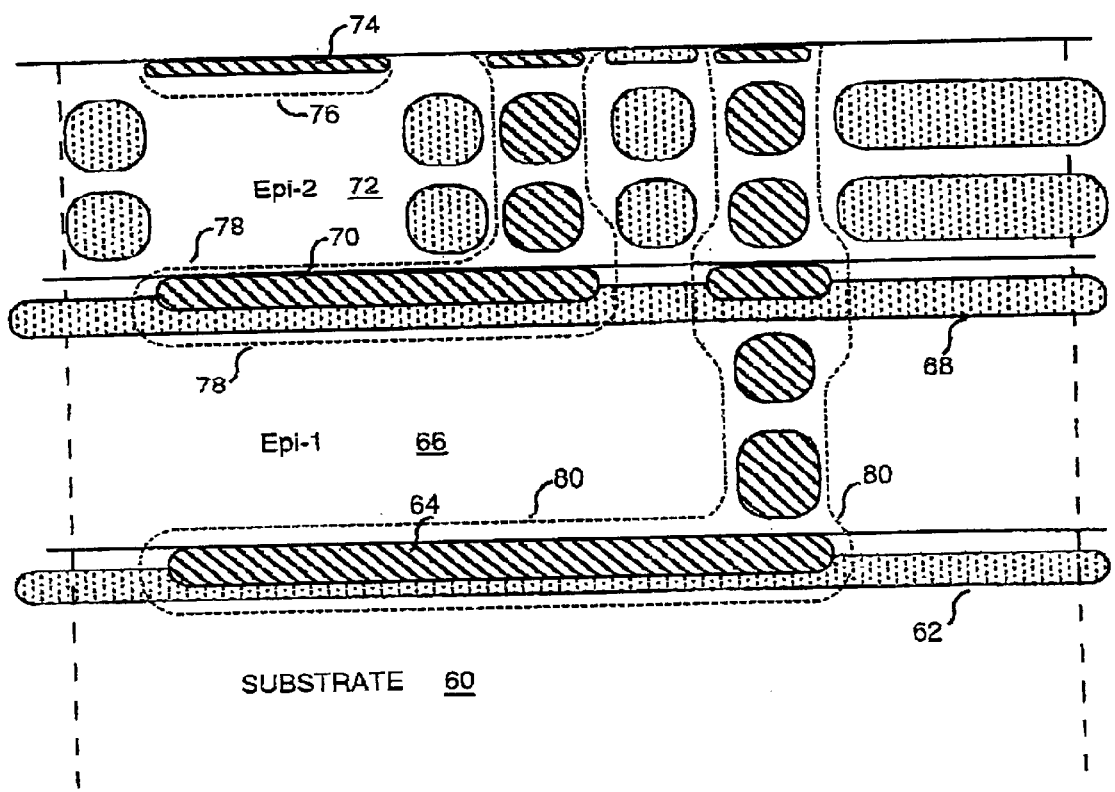
FIG. 3 is semiconductor cross sectional diagram illustrating a vertical color filter pixel sensor employing epitaxial semiconductor technology.

In another illustrative embodiment of the present invention shown schematically in FIG. 3, the six-layer structure of alternating p-type and n-type regions can be formed using a semiconductor substrate 60 of a first conductivity type as the bottom layer in which a blanket diffusion-barrier implant 62 of the first conductivity type and a single well 64 of a second opposite conductivity type are disposed. The diffusion barrier 62 prevents carriers generated in the substrate from migrating upward to the green photodiode and provides isolation between the red photodiodes. The well 64 acts as the detector for the red photodiode. In this embodiment of the invention, a first epitaxial layer 66 having the first conductivity having a blanket diffusion-barrier implant 68 of the first conductivity type is disposed over the surface of the semiconductor substrate 60 and the substrate well 64 and a well 70 of the second conductivity type is disposed in the first epitaxial layer 66. The diffusion barrier implant 68 prevents carriers generated in the first epitaxial layer 66 from migrating upward to the blue photodiode and provides isolation between green photodiodes. The well 68 acts as the detector for the green photodiode. A second epitaxial layer 72 of the first conductivity type is disposed over the surface of the first epitaxial layer 66 and its well 70 and a doped region 74 of the second conductivity type (which may be a lightly-doped-drain implant) is formed in the second epitaxial layer 72. Doped region 74 forms the blue detector.

Contact is made to the buried green detector 70 and the buried red detector 64 via deep contact plugs. The contact plug for the buried green detector 70 is formed through second epitaxial layer 72 and the contact for buried red detector 64 is formed through second epitaxial layer 72 and through first epitaxial layer 66 as will be described further herein.

The hatched areas of FIG. 3 show the approximate locations of the implants used to create the p-type and n-type regions of the structure. The dashed line 76 defines the approximate border between the net-P and net-N doping for the blue detector 74. Similarly, the dashed line 78 defines the approximate border between the net-P and net-N doping for the green detector 70 with its vertical portion to the surface of the second epitaxial layer 66 forming the contact to the green detector 70. The dashed line 80 defines the approximate border between the net-P and net-N doping for the red detector 64 with its vertical portion to the surface of the second epitaxial layer 66 forming the contact to the red detector 64.

As may be seen from the above-recited illustrative examples, other embodiments of the six-layer structure disclosed herein are contemplated to be within the scope of the present invention and may be realized by using various combinations of layers selected from among the substrate, one or more wells disposed in the substrate, one or more epitaxial layers, and one or more wells disposed in one or more epitaxial layers.

Persons of ordinary skill in the art will observe that all of the red, green, and blue photodiodes (indicated at reference numerals 64, 70, and 74, respectively, in FIG. 3) can be operated so that the depletion regions of the photodiodes do not interact (i.e. they are junction isolated) but may be alternatively operated either through control of doping levels, structure spacing or operating voltages such that the depletion regions do interact and may also be deeply depleted.

An illustrative semiconductor fabrication process for fabricating the vertical color filter detector group of FIG. 3 is disclosed with reference to FIGS. 4A through 4E, cross-sectional diagrams showing the structure resulting after completion of selected steps in the process.

Figure 4A:
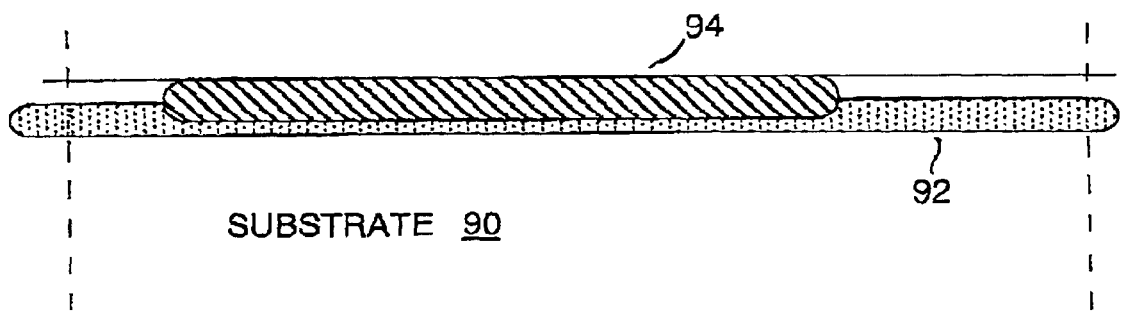
FIGS. 4A through 4E are cross-sectional diagrams showing the structure resulting after completion of selected steps in the fabrication process.

The process starts with a 1e15 p-type substrate 90 shown in FIG. 4A. A blanket boron implant (shown at reference numeral 92) is performed to a depth of about 0.5 um. This boron implant 92 must be more heavily doped than the substrate because it acts as weak diffusion barrier to prevent electrons generated in the substrate 90 from diffusing up to the green photodiode, as well as separating the red photodiodes. This blanket implant should generally be anywhere from about 3× to 100× of the substrate doping level and in one embodiment of the invention is about 1e16. Next, an implant masking layer (not shown) is then applied using conventional photolithographic techniques. Next, as shown in FIG. 4A, a masked phosphorus 1e17 implant (shown at reference numeral 94) is performed at an energy of around 50 keV followed by an activation cycle as is known in the art to form the n-type layer for the red detector. This implant dose should be selected to be sufficient to overcompensate the blanket p-type implant. Persons of ordinary skill in the art will appreciate that the drive cycle must ensure adequate annealing for both the boron and phosphorus implants prior to growth of an epitaxial silicon layer. Persons skilled in the art will also recognize that the order of the p-type blanket implant and the n-type masked implant to form the red photodiode n-type region could be reversed.

Figure 4B:
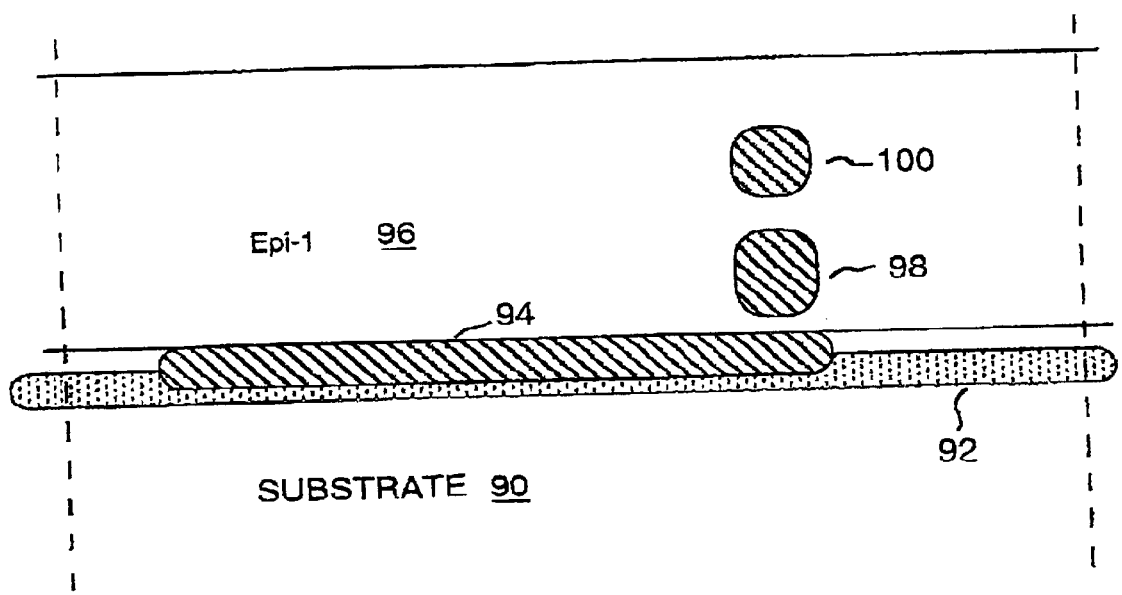

Referring now to FIG. 4B, next, a layer of 1e15 p-type epitaxial silicon 96 is grown to a thickness of about 2.0 um. The dopant concentration in the epitaxial layer 96 is as lightly doped as will guarantee p-type material in order that it will function as a potential well region so that photoelectrons generated therein do not diffuse past the p-type layers above or below it. Punch-through from red to green photodiodes is another design constraint affecting doping level in this layer, i.e., the doping needs to be sufficient to prevent depletion regions from the red and green photodiode cathodes from getting too close to each other, or fully depleting the p-type region between them.

Next, a plug implant masking layer (not shown) is then applied using conventional photolithographic techniques. A 1e17 phosphorus plug implant and an anneal sequence is then performed to form a plug contact to the cathode of the red photodiode. This plug implant should be a high-energy implant (i.e., about 1,000 KeV) or should comprise multiple implant steps at different energies. In one embodiment of the present invention, a tall, thin plug contact plug is formed by a combination of two different implants, one a high-energy implant 98 (i.e., about 1,200 KeV) for deep doping the bottom region of the plug contact, and the other a lower energy implant 100 (i.e., about 600 KeV) for doping the intermediate region of the plug contact, followed by a third implant or diffusion that is performed along with the doping for the green photodiode to complete the shallow surface region of the plug contact.

The plug resistance is not important since the photocurrent is small, however the size of the plug should be as small as possible to minimize pixel area and maximize fill factor. A plug size of 1 micron is a good target, but the depth of the plug contact needs to be about 2 microns. The multiple-implant plug disclosed herein makes it possible to achieve such a plug with a depth greater than its width.

Figure 4C:
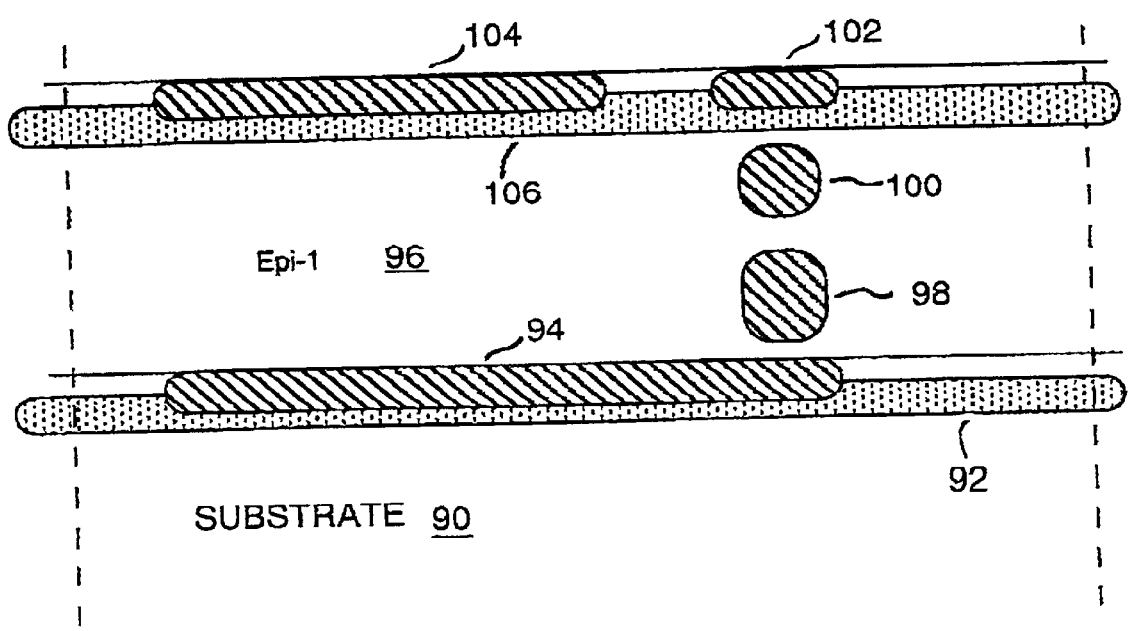

Referring now to FIG. 4C, an implant masking layer (not shown) is then applied using conventional photolithographic techniques. A 1e17 phosphorus implant at an energy of around 50 KeV (shown at reference numeral 104) and activation sequence is then performed to form the n-type layer for the green detector. A second, smaller aperture in this masking layer serves to form the surface region 102 of the plug contact implant for the contact to the underlying cathode of the red detector. As persons of ordinary skill in the art will appreciate, this implant requires activation drive to restore lattice integrity before the subsequent epitaxial layer deposition step.

Next, a blanket boron implant 106 of the epitaxial layer 96 is performed. This implant serves to counteract autodoping during the subsequent epitaxial layer deposition step. This implant also serves as a weak diffusion barrier to prevent green-photon-generated carriers from diffusing upward to the blue detector and separates the green photodiodes. This blanket implant 106 should generally be anywhere from about 3× to 100× of the doping level of the first epitaxial layer 96 and in one embodiment of the invention is about 1e16. Persons skilled in the art will also recognize that the order of the p-type blanket implant and the n-type masked implant to form the green photodiode n-type region could be reversed, and that the doping concentration considerations are similar to those described above for the red photodiode.

Figure 4D:
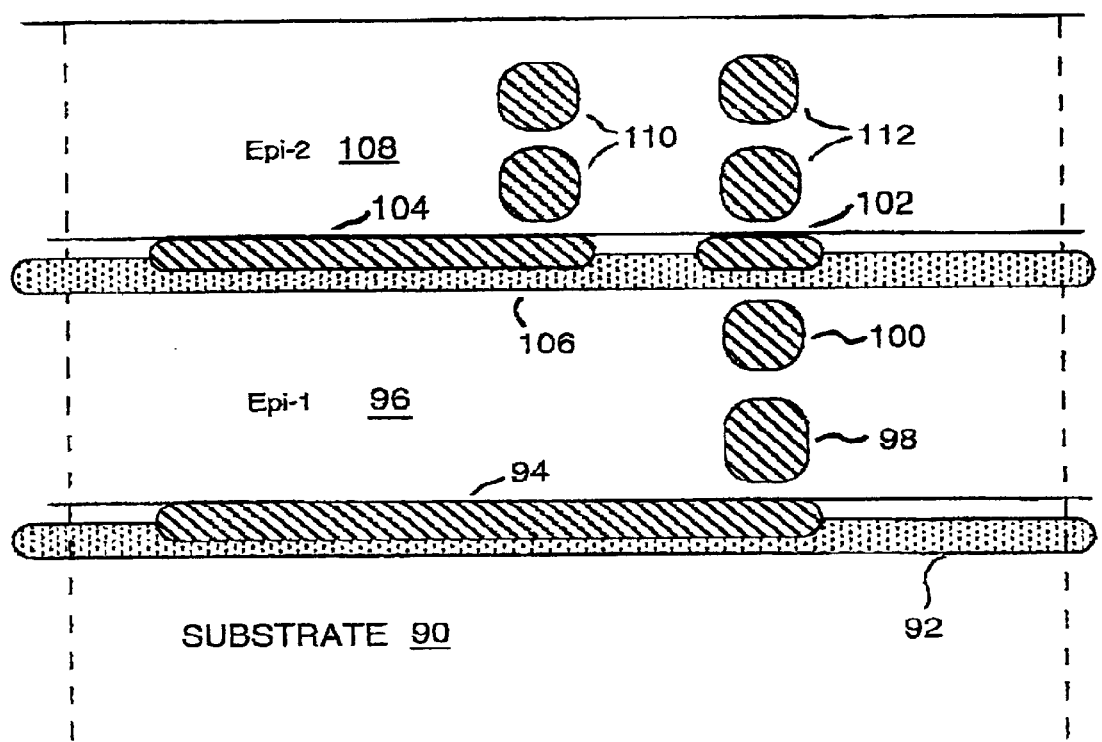

Referring now to FIG. 4D, a layer of 1e15 p-type epitaxial silicon 108 is grown to a thickness of about 0.7 to 1.0 um. An implant masking layer (not shown) is then applied using conventional photolithographic techniques. A standard CMOS n-well implant is performed to form n-well regions 110 to make contact to the cathode 104 of the underlying green detector and n-well region 112 to make contact to the top of the plug contact 102 for the cathode 94 of the bottom red detector. The n-well regions 110 and 112 may require a double implant to reach the buried layers comprising the cathode 106 of the green detector and the plug contact for the cathode 94 of the red detector; typical CMOS n-well implant energies are around 500 KeV and 100 KeV, respectively, for the deep and shallow implants in n-well regions 110 and 112.

Figure 4E:
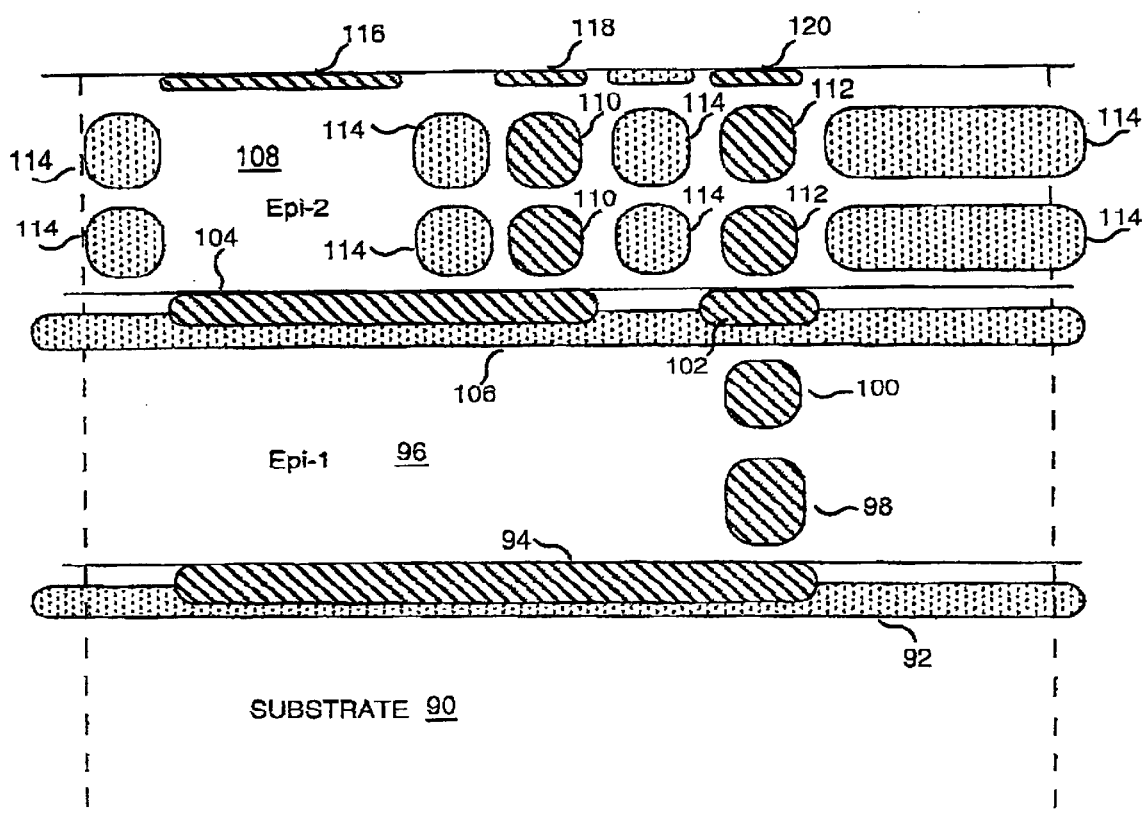

Referring now to FIG. 4E, an implant masking layer (not shown) is then applied using conventional photolithographic techniques. A CMOS p-well implant step is then performed to create p-well regions 114. As will be understood by persons of ordinary skill in the art, the CMOS p-well implant step may require a double energy implant to minimize the n-well-to-n-well spacing. These p-well regions 80 are for isolation between the contacts for the red and green detector plugs as well as between pixels (the rightmost and leftmost edge p-well regions). In addition, this p-well implant is used to create wells in which NMOS transistors for the rest of the circuitry on the chip will be formed.

Next, an implant masking layer (not shown) is then applied using conventional photolithographic techniques. A lightly-doped-drain implant shown at reference numeral 116 is then performed to form the cathode of the blue detector. In one embodiment of the invention, other apertures in this masking layer form surface portions of the deep contact regions for the red and green detectors, to allow good electrical contact to an overlying metal interconnect layer. Alternately, more heavily doped n-type regions may be formed in a separate processing step to form surface portions 118 and 120 of the deep contact regions for the red and green detectors as well as a contact region within the lightly-doped-drain implant for the blue detector. As an optional alternative to the illustrative process depicted in FIG. 4E, the cathode of the blue detector might be formed with a p-well underneath (i.e., an extension of regions 114).

The process employed for fabricating the vertical filter sensor group of the present invention is compatible with standard CMOS processes. The additional process steps are all performed prior to the standard CMOS steps, thus minimizing interactions.

Two epitaxial layers 96 and 108, as sometimes employed in BiCMOS, are required, as well as two extra implant activation cycles, one before each epitaxial growth step. As will be apparent to such persons of ordinary skill, three extra masks are required in the process for implanting the n-type regions 94, 98, 100 102, and 104 for the red detector, the red contact plug, and the green detector. The process requires five extra implants including the red detector counterdoping 92 and the green detector counterdoping 106 (six extra implants are required if regions 98 and 100 are formed separately). The masking, implanting, drive-in and anneal, and epitaxial growth fabrication process steps described above for fabricating the novel structure disclosed herein are individually well known to persons of ordinary skill in the semiconductor processing art for fabricating other semiconductor devices. Process parameters, such as times, temperatures, reactant species, etc. will vary between individual processes but are known for use in such individual processes. Such details will not be recited herein to avoid overcomplicating the disclosure and thus obscuring the invention.

The fabrication process disclosed herein provides several advantages. There are no large lateral diffusions associated with implant and drive wells, resulting in a smaller pixel area. The vertical plugs needed to connect to buried layers can be small.

There is no need for large n-type or p-type isolation rings. Only the detector plug contacts need to be isolated from each other and the other detectors. This allows for a small sensor group area.

As shown, this six-layer three-color photodiode structure uses two epitaxial layers, as are sometimes found in BiCMOS processes. Silicon quality generally improves as more epitaxial layers are grown. In addition, the sensor group including pixel readout circuits according to this embodiment of the present invention can be made in any BiCMOS fabrication facility. The topmost layers may be formed using a conventional CMOS process, (i.e., n+, n-well, and p-well). In addition, the layer referred to herein as the substrate may itself be an epitaxial layer formed on an underlying substrate.

Figure 5:
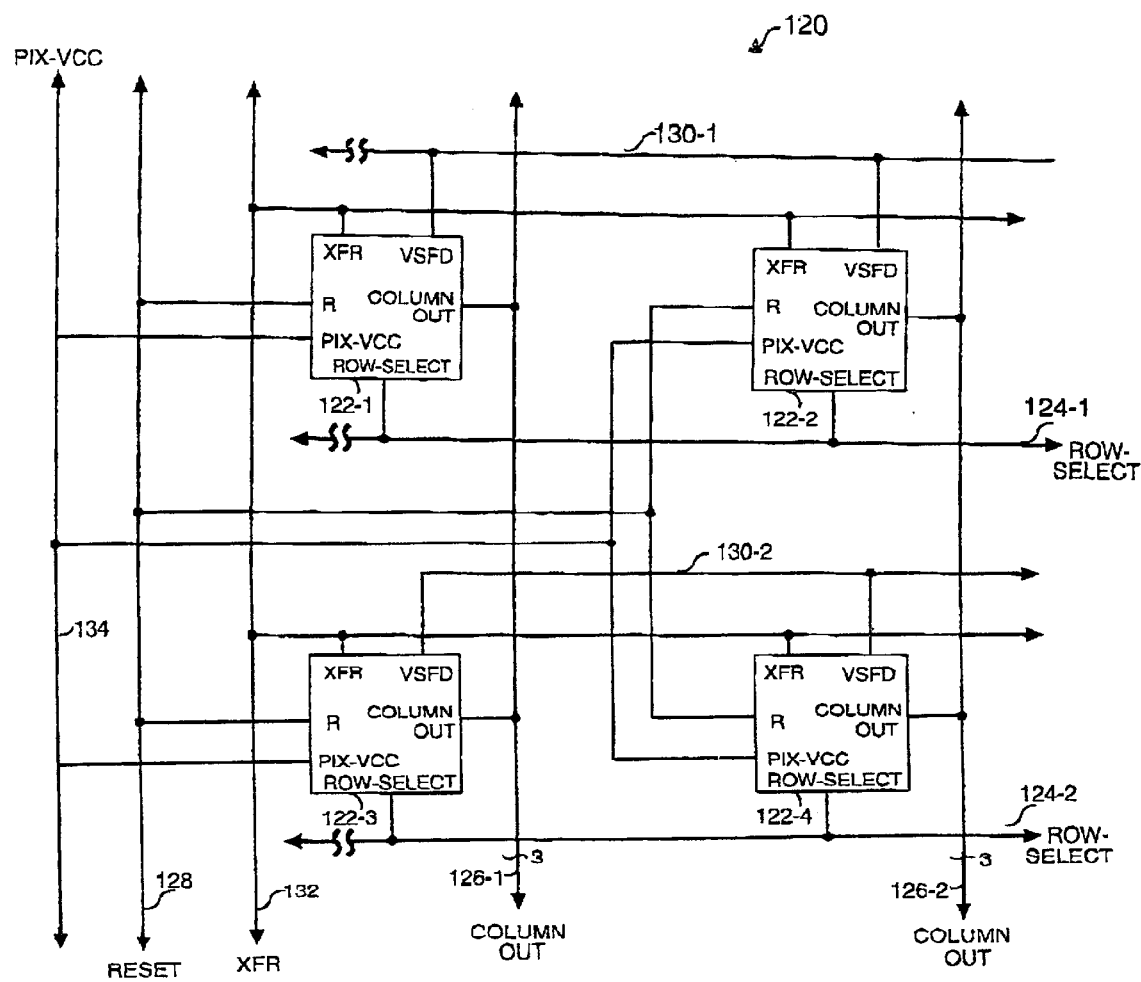
FIG. 5 is a diagram of an imaging array according to the present invention.

Referring now to FIG. 5, a diagram shows an illustrative 2 by 2 portion 120 of an array of vertical color filter detector groups according to the present invention. Persons of ordinary skill in the art will readily appreciate that the array portion disclosed in FIG. 5 is illustrative only and that arrays of arbitrary size may be fabricated using the teachings herein.

The illustrative array example of FIG. 5 employs circuitry with a storage feature such as is depicted in FIG. 2C including a transfer transistor and so includes a global transfer signal line serving the array. Persons of ordinary skill in the art will appreciate that arrays employing circuitry similar to that depicted in FIGS. 2A and 2B without storage and thus without a transfer transistor are also contemplated as within the scope of the present invention and that such arrays will not include a transfer signal line.

As would be expected by persons of ordinary skill in the art and as shown in FIG. 3, common RESET and XFR lines will be provided for all of the vertical color filter detector groups in the array. As presently preferred, a separate VSFD line is provided for each row in the array, although embodiments of the present invention having a single VSFD node are also contemplated. The source of the row select transistor for each color in FIGS. 2A through 2C in a column of the array will be coupled to a separate column line associated with that column and the gate of all row select transistors for all colors for each vertical color filter detector group in a row of the array will be coupled to a ROW-SELECT line associated with that row.

The 2 by 2 portion 120 of the array in FIG. 5 includes two rows and two columns of vertical color filter detector groups according to the present invention. A first row includes vertical color filter detector groups 122-1 and 122-2; a second row includes vertical color filter detector groups 122-3 and 122-4. A first column includes vertical color filter detector groups 122-1, 122-3; a second column includes vertical color filter detector groups 122-2 and 122-4.

A first ROW-SELECT line 124-1 is connected to the row-select inputs (ROW-SELECT) of vertical color filter detector groups 122-1 and 122-2. A second ROW-SELECT line 124-2 is connected to the row-select inputs (ROW-SELECT) of vertical color filter detector groups 122-3 and 122-4. The first and second ROW-SELECT lines may be driven from a row decoder (not shown) as is well known in the art.

A first set of three (blue, green, and red) COLUMN OUT lines 126-1 is connected to the outputs of vertical color filter detector groups 122-1 and 122-3. A second set of three COLUMN OUT lines 126-2 is connected to the outputs of vertical color filter detector groups 122-2 and 122-4. The first and second sets of COLUMN OUT lines are coupled to sets of column readout circuits (not shown) as is well known in the art.

A global RESET line 128 is connected to the reset (R) inputs of all of the vertical color filter detector groups 122-1 through 122-4. A first VSFD line 130-1 is connected to the VSFD inputs of the vertical color filter detector groups 122-1 and 122-2 in the first row of the array. A second VSFD line 130-2 is connected to the VSFD inputs of the vertical color filter detector groups 122-3 and 122-4 in the second row of the array. A global XFR line 132 is connected to the XFR inputs of all of the vertical color filter detector groups 122-1 through 122-4.

A global PIX-VCC line 134 is connected to the PIX-VCC inputs of all of the vertical color filter detector groups 122-1 through 122-4. Alternately, multiple PIX-VCC lines (one for each column) could be provided.

Figure 6A:
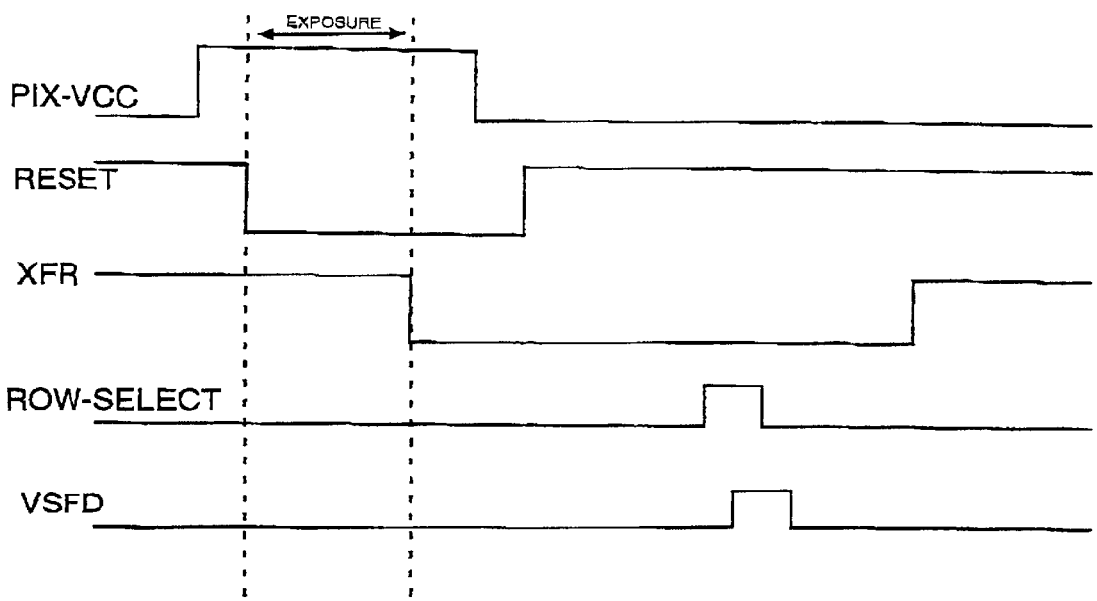
FIGS. 6A and 6B are timing diagrams that illustrate the operation of the pixel sensor of FIGS. 2A, 2B, and the array of FIG. 5.

Referring now to FIG. 6A, a timing diagram illustrates the operation of the embodiment of the vertical color filter detector groups shown in FIG. 2C of the present invention. Initially, the RESET signal is asserted high. The drains of the reset transistors 54b, 54g, and 54r are brought from zero volts to the voltage PIX-VCC. This action resets all vertical color filter detector groups in the array by placing the voltage potential PIX-VCC at the cathode of each photodiode. According to one method for operating the vertical color filter detector groups of the present invention illustrated in FIG. 6A, the voltage PIX-VCC is initially at a low level (e.g., to zero volts) while RESET is high to reset the cathode voltages of all photodiodes in the array to a low value to quickly equalize their states. Then the voltage PIX-VCC is raised (e.g., to about 2 volts) for a predetermined time (preferably on the order of a few milliseconds) while the RESET signal is still asserted to allow the photodiodes in all vertical color filter detector groups to charge up to about 1.4 volts. The black level at the photodiode cathodes is thus set to PIX-VCC, less a little for the capacitive turn-off transient from the reset transistors.

When the RESET signal is de-asserted and photointegration begins, charge accumulates on the photodiode cathodes. The voltage at the source of the source-follower transistors 56b, 56g, and 56r, follows the voltage on their gates. In embodiments of the present invention that employ transfer transistors 59b, 59g, and 59r, the XFR signal is asserted throughout the reset period and the integration period and is de-asserted to end the integration period as illustrated in FIG. 6A. The low level of the XFR signal is preferably set to zero or a slightly negative voltage, such as about −0.2 volts, to thoroughly turn off transfer transistors 59b, 59g, and 59r.

To read out a pixel sensor, the drains of the source-follower transistors 56b, 56g, and 56r are driven to the voltage VSFD, the ROW-SELECT signal for the row of the array containing the transistors 59b, 59g, and 59r is asserted, and the output signal is thereby driven onto COLUMN OUT lines. The timing of the assertion of the VSFD signal is not critical, except that it should remain high until after the ROW-SELECT signal is de-asserted as illustrated in FIG. 6A. It may be advantageous to limit the voltage slope at the rising edge of the ROW-SELECT signal if VSFD is raised first, as disclosed in co-pending application Ser. No. 09/492,103, filed Feb. 14, 2000, docket No. FOV-038.

Figure 6B:
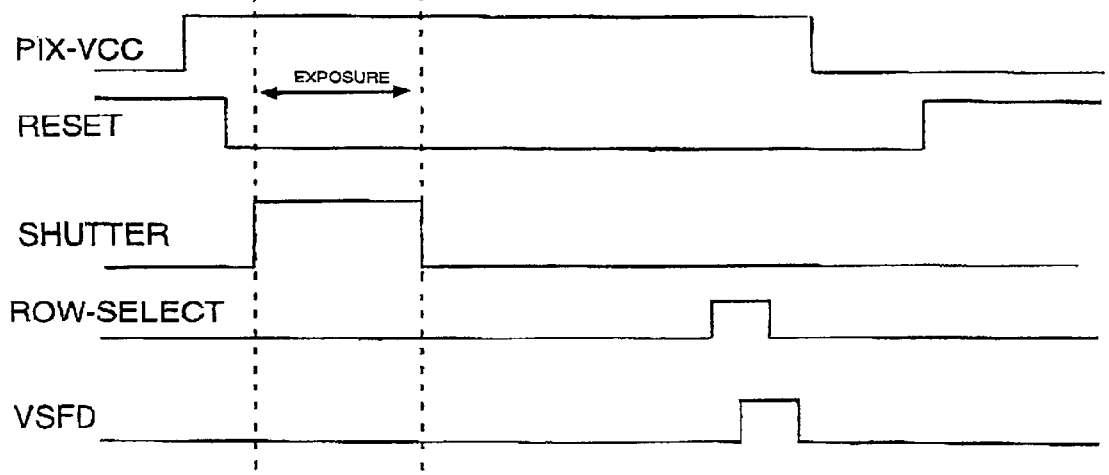

Referring now to FIG. 6B, a timing diagram illustrates one method for operating the sensor group realization of FIG. 2B. The reset operation proceeds as described relative to FIG. 6A. After RESET falls, exposure can begin; however, since without the XFR switch the active pixel sensor does not have an electronic shutter capability, it may be the case that a mechanical shutter is used to control the exposure. Accordingly, a SHUTTER signal is shown, indicative of a time when a shutter is letting light fall on the sensor. After the shutter closes, the RESET signal is not re-asserted as it was in FIG. 6A, since the signal needs to remain stored on the photodiode cathodes until after readout. Readout using ROW-SELECT and VSFD works as described with respect to FIG. 6A. After readout, PIX-VCC and RESET can be cycled back to their initial states.

As is well known in the art, there are other methods of operating 3-transistor active pixel sensor to avoid the need for a shutter.

The control signals depicted in FIGS. 6A and 6B may be generated using conventional timing and control logic. The configuration of the timing and control logic circuit will depend on the particular embodiment of the present invention, but in any event will be conventional circuitry, the particular design of which is a trivial task for persons of ordinary skill in the art having examined FIGS. 6A and 6B once a particular embodiment of the present invention is selected.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A vertical color filter detector group formed on a semiconductor substrate and comprising at least three detector layers configured by doping to collect photo-generated carriers of a first polarity, separated by additional intervening reference layers configured by doping to collect and conduct away photo-generated carriers of the opposite polarity, said at least three detector layers disposed substantially in vertical alignment with each other and having different spectral sensitivities as a function of their different depths in the semiconductor substrate, wherein said doping of said at least three detector layers and said doping of said plurality of reference layers is such as to cause junction isolation between adjacent ones of said detector layers and said reference layers.

2. A vertical color filter detector group formed on a semiconductor substrate comprising:
   at least three detector layers configured to collect photo-generated carriers of a first polarity, separated by additional intervening reference layers configured to collect and conduct away photo-generated carriers of the opposite polarity, said at least three detector layers disposed substantially in vertical alignment with each other and having different spectral sensitivities as a function of their different depths in the semiconductor substrate, wherein each detector group includes:
      a blue photodetector at a blue-sensitive n-type layer at the surface of the semiconductor,
      a green photodetector at a green-sensitive n-type layer disposed at a first depth in said semiconductor,
      a red photodetector at a red-sensitive n-type layer disposed at a second depth greater than said first depth in said semiconductor,
      wherein:
         a reference layer is disposed below said blue-sensitive n-type layer;
         reference layers are disposed above and below said green-sensitive n-type layer and said red-sensitive n-type layer.

3. A vertical color filter detector group formed on a semiconductor substrate comprising:
   at least three detector layers configured to collect photo-generated carriers of a first polarity, separated by additional intervening reference layers configured to collect and conduct away photo-generated carriers of the opposite polarity, said at least three detector layers disposed substantially in vertical alignment with each other and having different spectral sensitivities as a function of their different depths in the semiconductor substrate; and
   a diffusion barrier region disposed in a layer below a lowest one of said detector layers.

4. A vertical color filter detector group formed on a semiconductor substrate comprising:
   at least three detector layers configured to collect photo-generated carriers of a first polarity, separated by additional intervening reference layers configured to collect and conduct away photo-generated carriers of the opposite polarity, said at least three detector layers disposed substantially in vertical alignment with each other and having different spectral sensitivities as a function of their different depths in the semiconductor substrate; and a diffusion barrier region disposed in a layer below a second lowest one of said detector layers.

5. The vertical color filter detector group of claim 4 further including:

a diffusion barrier region disposed in a layer below a lowest one of said detector layers.

6. A vertical color filter detector group formed on a semiconductor substrate comprising at least six layers of alternating p-type and n-typed doped regions, PN junctions formed between abutting ones of said doped regions operating as photodiodes having spectral sensitivities that are a function of junction depth from an upper surface of said at least six layers, first alternate ones of said doped regions disposed substantially in vertical alignment with each other and serving as detector regions to collect photo-generated carriers, second alternate ones of said doped regions that are not detector regions serving as reference regions coupled to a reference potential.

7. The vertical color filter detector group of claim 6 wherein:

said detector regions comprise n-type doped regions;

said reference regions comprise p-type doped regions; and said reference potential is ground.

8. The vertical color filter detector group of claim 7 wherein:

a blue detector region comprises a first n-type layer at an upper surface of said at least six layers;

a green detector region comprises a second n-type layer disposed below said first n-type layer; and a red detector region comprises a third n-type layer disposed below said second n-type layer.

9. The vertical color filter detector group of claim 8 wherein:

a bottom surface of said blue detector region lies at a depth of between about 0.05 microns and about 0.5 microns from a top surface of said first n-type semiconductor layer;

a bottom surface of said green detector region lies at a depth of between about 0.5 microns and about 1.5 microns from said top surface of said first n-type semiconductor layer; and a bottom surface of said red detector region lies at a depth of between about 1.5 microns and about 3.5 microns from said top surface of said first n-type semiconductor layer.

10. The vertical color filter detector group of claim 8 wherein:

a bottom surface of said blue detector region lies at a depth of about 0.3 microns from a top surface of said first n-type semiconductor layer;

a bottom surface of said green detector region lies at a depth of about 1.0 microns from said top surface of said first n-type semiconductor layer; and a bottom surface of said red detector region lies at a depth of about 2.5 microns from said top surface of said first n-type semiconductor layer.

11. The vertical color filter detector group of claim 8 further including:

blue active pixel sensor circuitry coupled to said blue detector region;

green active pixel sensor circuitry coupled to said green detector region; and red active pixel sensor circuitry coupled to said red detector region.

12. The vertical color filter detector group of claim 8 wherein said blue, green, and red pixel sensor circuitry each comprises;

a reset transistor having a source coupled to its corresponding detector region, a gate coupled to a reset signal line, and a drain coupled to a reset reference potential;

a source-follower transistor having a gate coupled to its corresponding detector region, a drain coupled to a drain supply potential, and a source; and a row-select transistor having a drain coupled to said source of said source-follower transistor, a source coupled to a column output line, and a gate coupled to a row-select signal line.

13. The vertical color filter detector group of claim 8 wherein said blue, green, and red pixel sensor circuitry each comprises;

a reset transistor having a source coupled to its corresponding detector region, a gate coupled to a reset signal line, and a drain coupled to a reset reference potential;

a transfer transistor having a drain coupled to said source of said reset transistor, a gate coupled to a transfer signal line, and a source a source-follower transistor having a gate coupled to said source of said transfer transistor, a drain coupled to a drain supply potential, and a source; and a row-select transistor having a drain coupled to said source of said source-follower transistor, a source coupled to a column output line, and a gate coupled to a row-select signal line.

14. A vertical color filter detector group formed on a semiconductor substrate of a first conductivity type comprising:

a first well of a second conductivity type opposite said first conductivity type formed in the substrate;

a first epitaxial layer of said first conductivity type formed over an upper surface of said semiconductor substrate;

a second well of said second conductivity type formed in said first epitaxial layer in substantial vertical alignment with said first well;

a second epitaxial layer of said first conductivity type formed over an upper surface of said first epitaxial layer;

a shallow diffusion of said second conductivity type formed in said second epitaxial layer in substantial vertical alignment with said first well;

wherein said substrate and said first and second epitaxial regions are coupled to a reference potential.

15. The vertical color filter detector group of claim 14, further including:

a red contact region of said second conductivity type formed through said first and second epitaxial layers making an electrical contact between said first well and an upper surface of said second epitaxial layer, said red output contact region being higher than it is wide; and a green contact region of said second conductivity type formed through said second epitaxial layer making an electrical contact between said second well and an upper surface of said second epitaxial layer.

16. The vertical color filter detector group of claim 15 wherein said first conductivity type is p-type and said second conductivity type is n-type.

17. The vertical color filter detector group of claim 14 wherein said reference potential is ground.

18. The vertical color filter detector group of claim 14 wherein:

a bottom surface of said shallow diffusion lies at a depth of between about 0.05 microns and about 0.5 microns from a top surface of said second epitaxial layer;

a bottom surface of said second well lies at a depth of between about 0.5 microns and about 1.5 microns from said top surface of said second epitaxial layer; and a bottom surface of said first well lies at a depth of between about 1.5 microns and about 3.5 microns from said top surface of said second epitaxial layer.

19. The vertical color filter detector group of claim 14 wherein:

a bottom surface of said shallow diffusion lies at a depth of about 0.3 microns from said top surface of said second epitaxial layer;

a bottom surface of said second well lies at a depth of about 1.0 microns from said top surface of said second epitaxial layer; and a bottom surface of said first well lies at a depth of about 2.5 microns from said top surface of said second epitaxial layer.

20. The vertical color filter detector group of claim 15 further including:

blue active pixel sensor circuitry coupled to said shallow diffusion;

green active pixel sensor circuitry coupled to said second well; and red active pixel sensor circuitry coupled to said first well.

21. The vertical color filter detector group of claim 20 wherein said blue, green, and red active pixel sensor circuitry each comprises;

a reset transistor having a source coupled to the one of said first and second wells and said shallow diffusion associated with its color, a gate coupled to a reset signal line, and a drain coupled to a reset reference potential;

a source-follower transistor having a gate coupled to the one of said first and second wells and said shallow diffusion associated with its color, a drain coupled to a drain supply potential, and a source; and a row-select transistor having a drain coupled to said source of said source-follower transistor, a source coupled to a column line, and a gate coupled to a row-select signal line.

22. The vertical color filter detector group of claim 20 wherein said blue, green, and red active pixel sensor circuitry each comprises;

a reset transistor having a source coupled to the one of said first and second wells and said shallow diffusion associated with its color, a gate coupled to a reset signal line, and a drain coupled to a reset reference potential;

a transfer transistor having a drain coupled to said source of said reset transistor, a gate coupled to a transfer signal line, and a source a source-follower transistor having a gate coupled to said source of said transfer transistor, a drain coupled to a drain supply potential, and a source; and a row-select transistor having a drain coupled to said source of said source-follower transistor, a source coupled to a column line, and a gate coupled to a row-select signal line.

* * * * *